(12) United States Patent
Farrar (10) Patent No.: US 6,541,858 B1
(45) Date of Patent: Apr. 1, 2003

(54) INTERCONNECT ALLOYS AND METHODS AND APPARATUS USING SAME

(75) Inventor: Paul A. Farrar, So. Burlington, VT (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/213,697

(22) Filed: Dec. 17, 1998

(51) Int. Cl.$^7$ ............................................... H01L 29/40
(52) U.S. Cl. ........................ 257/741; 257/752; 257/768
(58) Field of Search ................................. 257/775, 774, 257/768, 741, 752

(56) References Cited

U.S. PATENT DOCUMENTS

| | | | | |
|---|---|---|---|---|
| 4,240,845 A | * | 12/1980 | Esch et al. | .................... 148/1.5 |
| 5,789,317 A | | 8/1998 | Batra et al. | .................. 438/642 |
| 6,093,265 A | * | 7/2000 | Brenneman | .................. 148/432 |

OTHER PUBLICATIONS

*ASM Handbook, vol. 3, Alloy Phase Diagrams*, Table of Contents, (1992).
"Metallography, Structures and Phase Diagrams", *Metals Handbook Eighth Edition, 8*, American Society for Metals, pp. 252–253, 255–256, 266–268, 294, 296, 300, 302, (1973).
"Properties and Selection: Nonferrous Alloys and Pure Metals", *Metals Handbook Ninth Edition, vol. 2*, American Society for Metals, Metals Park, Ohio, p. 673, (1979).
Elliott, R.P., *Constitution of Binary Alloys, First Supplement*, 2 pages, (1985).
Kaanta, C., et al., "Dual Damascene: A ULSI Wiring Technology", *VMIC Conference*, 144–152, (Jun. 1991).
Moffatt, W.G., *The Handbook of Binary Phase Diagrams, 2*, Genium Publishing Corporation, 2 pages, (1984).
Robinson, R.N., "Periodic Table of Elements", *Chemical Engineering Reference Manual*, Appendix D, 3 pages, (1987).

\* cited by examiner

Primary Examiner—Roy Potter
(74) Attorney, Agent, or Firm—Schwegman, Lundberg, Woessner & Kluth, P.A.

(57) ABSTRACT

Integrated circuit interconnect alloys having copper, silver or gold as the major constituent element. The resulting reduction in melting temperature allows for improved coverage of high aspect ratio features with reduced deposition pressure. The alloys are used to fabricate interconnects in integrated circuits, such as memory devices. The interconnects can be high aspect ratio features formed using a dual damascene process. The integrated circuits having the interconnects are applicable to semiconductor dies, devices, modules and systems.

18 Claims, 5 Drawing Sheets

INTERCONNECT ALLOYS AND METHODS AND APPARATUS USING SAME

TECHNICAL FIELD OF THE INVENTION

The invention relates generally to integrated circuits and, in particular, the invention relates to the use of alloys for producing metal interconnects in integrated circuits.

BACKGROUND OF THE INVENTION

As the density of semiconductor devices continues to increase, the need for smaller interconnections also increases. Historically, the semiconductor industry has used a subtractive etching process to pattern metal interconnect layers of the semiconductor. This metal processing technique, however, has limitations including poor step coverage, non-planarity, shorts and other fabrication problems. To address these problems, a dual damascene technique has been developed. This process, as explained in "Dual Damascene: A ULSI Wiring Technology", Kaanta et al., 1991 VMIC Conference, 144–150 (Jun. 11–12, 1991) and incorporated herein by reference, involves the deposition of a metal into contact vias and conductor trenches which are patterned in the semiconductor. The semiconductor is then subjected to a known CMP (chemical-mechanical polish) process to both planarize the semiconductor and to remove excess metal from all but the patterned areas.

The metal layer can be fabricated using known CVD (chemical vapor deposition) or PVD (physical vapor deposition) techniques. Filling the patterned structures formed during the dual damascene technique, however, has proved difficult. This difficulty is exaggerated as the aspect ratio (depth to width) of the patterns increase. As such, the use of high pressure to achieve improved fill in sub-micron conductor processing for ULSI integrated circuits has received considerable attention recently. One of the problems encountered is that high temperatures must be combined with high pressure to achieve conditions where sufficient metal flow will take place to fill the narrow troughs in the damascene process.

During the metal deposition process, an aluminum alloy which may contain such elements as copper and silicon, is deposited on the integrated circuit wafer. Aluminum has been typically used due to its low resistance and good adhesion to $SiO_2$ and Si. Silicon is usually added as an alloying element to alleviate junction spiking in Al contacts to Si. Further, electromigration and hillocks (spike-like formations) can be reduced by adding Cu, Ti, Pd or Si to aluminum to form alloys. These alloying elements precipitate at the grain boundaries. Thus, the grain boundaries are "plugged" and vacancy migration is inhibited.

As interconnects become smaller, the electrical properties of the interconnect become more critical. Resistance of the interconnect rises as the cross-sectional area decreases. As resistance rises, performance of the integrated circuit decreases and power consumption rises.

For the reasons stated above, and for other reasons stated below which will become apparent to those skilled in the art upon reading and understanding the present specification, there is a need in the art for alloys which can be used to fill high aspect ratio structures in an integrated circuit and that have improved electrical properties. Specifically, alloys and alloy systems are needed which will enable force fill to be achieved with improved electrical properties over the standard Al-0.5% Cu alloy which is used by much of the industry.

SUMMARY OF THE INVENTION

The above-mentioned problems with metal interconnect alloys in an integrated circuit and other problems are addressed by the invention, and which will be understood by reading and studying the following specification. Interconnect alloys are described which facilitate the use of the Group 1B transition metals, i.e., gold, silver and copper, in the fabrication of high aspect ratio features. Group 1B transition metals have improved electrical characteristics over aluminum. In particular, the invention describes interconnect alloys for use in an integrated circuit, wherein the interconnect alloys have copper, silver or gold as their major constituent element. Unless otherwise noted, alloy composition percentages refer to weight percent of the total alloy.

The invention provide alloy systems and methods for use in the fabrication of integrated circuits, dies, modules and systems. The alloys of the invention facilitate filling high aspect ratio features using force filling of a dual damascene process, wherein the interconnects have improved electrical properties over the standard Al-0.5% Cu alloy used by much of the industry.

In one embodiment, an alloy has a Group 1B transition metal as the major constituent element. The alloy further contains at least one additional element having less than approximately 2% solubility by weight in the Group 1B transition metal at approximately 100° C., wherein each at least one additional element individually produces a eutectic temperature with the Group 1B transition metal of more than 90° C. below the melting point of the pure Group 1B transition metal. In another embodiment, the at least one additional element individually produces a eutectic temperature with the Group 1B transition metal of more than 300° C. below the melting point of the pure Group 1B transition metal. In a further embodiment, the at least one additional element individually produces a eutectic temperature with the Group 1B transition metal of more than 600° C. below the melting point of the pure Group 1B transition metal.

In one embodiment, an alloy has copper as the major constituent element. The alloy further contains one or more of the elements titanium, zirconium, hafnium, lithium, magnesium and phosphorous.

In another embodiment, an alloy has silver as the major constituent element. The alloy further contains one or more of the elements beryllium, bismuth, germanium, lead and silicon.

In a further embodiment, an alloy has gold as the major constituent element. The alloy further contains one or more of the elements bismuth, cobalt, germanium, lead, antimony and silicon.

In one embodiment, an alloy has copper as the major constituent element. The alloy further contains two or more of the elements magnesium, phosphorous, titanium, hafnium and zirconium in a ternary, quaternary or higher order eutectic system having a eutectic temperature of less than approximately 714° C.

In another embodiment, an alloy has silver as the major constituent element with approximately 1.6 to 2.6% by weight of bismuth and less than approximately 1% by weight of silicon. In yet another embodiment, the alloy is subjected to a heat treatment after filling. In still another embodiment, the alloy is subjected to a heat treatment after filling, wherein the heat treatment comprises exposing the alloy to temperatures of approximately 150° C. for a period of time from approximately one to twenty hours.

In another embodiment, an alloy has gold as the major constituent element with approximately 0.5 to 1.5% by weight each of one or more of the elements bismuth, lead, antimony and silicon.

In a further embodiment, a method of fabricating an integrated circuit interconnect is described. The method comprises forming contact vias and interconnect trenches in an insulator layer, depositing a metal alloy in the contact vias and interconnect trenches, and removing excess metal alloy to provide defined interconnects. The alloy comprises an inventive alloy as described herein.

In a still further embodiment, an integrated circuit memory device is provided which comprises an array of memory cells, internal circuitry, and interconnects coupled to the array of memory cells and internal circuitry. At least one of the interconnects comprises an inventive alloy as described herein.

In another embodiment, the invention provides a semiconductor die having a memory device contained thereon, the memory device comprising an array of memory cells, internal circuitry, and interconnects coupled to the array of memory cells and internal circuitry. At least one of the interconnects comprises an inventive alloy as described herein.

In yet another embodiment, the invention provides a circuit module having a memory device contained therein, the memory device comprising an array of memory cells, internal circuitry, and interconnects coupled to the array of memory cells and internal circuitry. At least one of the interconnects comprises an inventive alloy as described herein.

In another embodiment, the invention provides an electronic system having a memory device contained therein, the memory device comprising an array of memory cells, internal circuitry, and interconnects coupled to the array of memory cells and internal circuitry. At least one of the interconnects comprises an inventive alloy as described herein.

DETAILED DESCRIPTION OF THE INVENTION

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the invention. The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the invention is defined only by the appended claims, along with the full scope of equivalents to which such claims are entitled.

A description of the fabrication of metal conductors and contacts, i.e., interconnects, in an integrated circuit using a dual damascene process with the present invention is provided. Referring to FIGS. 1A–1E, a semiconductor base layer 100 is fabricated with a first insulator layer 102, such as an oxide layer, on the base layer 100. The base layer 100 is typically silicon having regions which are either p-type or n-type doped. A conductive area 104 is provided above the base layer 100. This conductive area 104 can be any type of conductor or semiconductor, such as polysilicon, metal or doped silicon. A second insulator layer 106 is fabricated on top of the first insulator layer 102. Using known pattern and etch techniques, a contact via 108, or opening, is formed in second insulator layer 106 to access conductive area 104. A contact via 110 is also formed in the second insulator layer 106 and first insulator layer 102 to access base layer 100. The vias 108 and 110 may be tapered, orthogonal or any other three-dimensional recess shape, and are intended to provide access to any region or material which is desired to be coupled to a conductor interconnect. The first insulator layer 102 and second insulator layer 106 may be referred to in combination as an insulator layer.

Conductor interconnect trenches 112 are patterned and etched into the second insulator layer 106. As stated above, the depth to width ratio (aspect ratio) of the trenches and vias are typically high. This high aspect ratio creates difficulty in properly filling the features with a metal alloy. The compositions of alloys in accordance with the invention are described below, following a description of the remaining steps in the dual damascene process.

After the trenches and access vias are formed, a layer of alloy 114 (and optional barrier metallurgy) is deposited on the device as described more fully below. A physical vapor deposition technique, known to those skilled in the art, is used to provide the layer of alloy 114 on top of layer 106. Alloy 114 is force filled into interconnect trenches 112 and vias 108 and 110 using elevated temperatures and pressures. A chemical-mechanical polish process is implemented to remove excess alloy from the top surface of the structure and provide defined interconnects 116.

To achieve low flow resistance for force filling the alloys, it is desirable to operate as near the melting point of the alloy as possible. This can be achieved by either raising the temperature at which the fill takes place or lowering the melting point of the alloy used. As elevated temperatures are undesirable because of processing concerns, as well as possible device and structural problems, lower melting point alloys specifically tailored to integrated circuit use is preferred. The inventive alloys have a substantially reduced melting point in comparison to the major constituent element, and improved electrical properties over the standard Al-0.5% Cu alloy which is used by much of the industry.

In order to achieve a relatively high conductivity, the elements used to lower the melting point have a relatively low solubility in the major constituent element at the integrated circuit operating temperatures. Solubilities are generally less than approximately 2% by weight at the integrated circuit operating temperatures. Typical maximum integrated circuit operating temperatures are expected to be under approximately 100° C. It is desirable, although not essential, that at least one of the elements used in the alloy enhances the electromigration resistance of the major constituent element.

The inventive alloys contain a Group 1B transition metal as the major constituent element. The Group 1B transition metals have melting temperatures which are generally too high for practical use as interconnect metals, where force fill is used, in their pure state. To overcome this obstacle, the inventive alloys further contain at least one additional element having less than approximately 2% solubility by weight in the major constituent element at approximately 100° C., wherein each at least one additional element individually produces a eutectic temperature with the major constituent of more than 90° C. below the melting point of the pure major constituent element. Such additional elements will generally also be metals, although non-metal elements such as silicon and phosphorous have been shown to meet these criteria for one or more of the Group 1B transition metals. In another embodiment, at least one additional element individually produces a eutectic temperature with the major constituent of more than 300° C. below the melting point of the pure major constituent element. In a further embodiment, at least one additional element individually produces a eutectic temperature with the major constituent of more than 600° C. below the melting point of the pure major constituent element. In a still further embodiment, each at least one additional element comprises less than 10% by weight of the total alloy. In yet another embodiment, each at least one additional element comprises less than approximately 6% by weight of the total alloy. The inventive alloys are more fully described below.

Alloys Having Copper as the Major Constituent

Copper has considerable advantages over the aluminum alloys known in the art. However, copper requires the use of high pressures combined with high temperatures in order to achieve conditions where sufficient metal flow will take place in the damascene process. The melting point of pure copper is approximately 1083° C. In the case of copper, the required temperatures are incompatible with other parts of the semiconductor structure such that detrimental effects would be suffered by an integrated circuit. The elements of titanium, zirconium, hafnium, magnesium, phosphorous and lithium are known to lower the melting point of copper, when added in sufficient quantities. Data for these elements are shown in Table 1. These elements also have relatively low solubilities in copper at temperatures below approximately 500° C. as shown in Table 1. In order to achieve maximum reductions in melting temperature, the maximum solubility in the solid solution at the eutectic temperature must be exceeded for these copper alloys.

TABLE 1

Copper Alloy Additions

| Element Added | Maximum Solubility (wt %) | Solubility at 100° C. (wt %) | Solubility at 500° C. (wt %) | Solubility at 700° C. (wt %) | Eutectic Temperature (° C.) |
|---|---|---|---|---|---|
| Titanium | 4.7 | | <1 | | 896 |
| Zirconium | 0.15 | | | 0.02 | 966 |
| Hafnium | 1.1 | | | | 988 |
| Lithium | 2.7 | ~2.0 | | | 179 |
| Magnesium | 3.3 | | ~2 | | 722 |
| Phosphorous | 1.75 | | ~1 | | 714 |

From the data in Table 1, it is apparent that the elements titanium, zirconium and hafnium all result in lowering the melting point by less than approximately 200° C. as single additions. In the case of lithium, the achievable reduction is in excess of approximately 900° C. The elements magnesium and phosphorous lower the melting point by approximately 350° C. It is expected that the use of more than one of these eutectic-forming materials as alloying additions will form a ternary or higher-order alloy with even lower melting point than the lowest melting binary alloy.

It is believed that a maximum reduction in melting point could be achieved with a copper-lithium alloy having approximately 3 to 3.5% by weight of lithium. However, as the solubility of lithium in copper at 100° C. (an anticipated maximum potential use temperature) is approximately 2% by weight (approximately 10 atomic percent), such solubility levels would have a significant detrimental effect on the conductivity of the resulting alloy. Significant losses in conductivity result in slower operation of an integrated circuit along with higher power requirements.

Magnesium and phosphorous have more desirable solubilities of less than approximately 1 to 2% by weight at the potential use temperatures. Copper alloys containing approximately 4% by weight of magnesium and approximately 2% by weight of phosphorous provide a significant reduction in the temperature necessary for force filling operations without a catastrophic loss in conductivity. Furthermore, additions of 1 to 2% by weight each of zirconium, hafnium and/or titanium further reduce the melting point of the resulting alloy and thereby reduce the force filling temperature required. Particularly desirable copper alloys include the additions of two or more of the elements phosphorous, magnesium, titanium, hafnium and zirconium wherein the resulting eutectic temperature is less than approximately 714° C.

In one embodiment, the copper alloy contains two or more of the elements magnesium, phosphorous, titanium, hafnium and zirconium in a ternary, quaternary or higher order eutectic system having a eutectic temperature of less than approximately 714° C. In another embodiment, the copper alloy has approximately 3 to 6% by weight of magnesium, approximately 1.0 to 2.0% by weight of phosphorus, and approximately 1.0 to 1.5% by weight of hafnium. In a further embodiment, the copper alloy has approximately 3 to 6% by weight of magnesium, approximately 1.0 to 2.0% by weight of phosphorus, and approximately 1.0 to 1.5% by weight of zirconium. In a still further embodiment, the copper alloy has approximately 3 to 6% by weight of magnesium, approximately 1 to 2% by weight of phosphorus, and approximately 1.0 to 1.5% by weight of titanium.

In another embodiment, the copper alloy has approximately 3 to 6% by weight of magnesium, approximately 1 to 2% by weight of phosphorus, approximately 1.0 to 1.5% by weight of hafnium, and approximately 1.0 to 1.5% by weight of zirconium. In a further embodiment, the copper alloy has approximately 3 to 6% by weight of magnesium, approximately 1 to 2% by weight of phosphorus, approximately 1 to 2% by weight of hafnium, approximately 1.0 to 1.5% by weight of zirconium, and approximately 1.0 to 1.5% by weight of titanium.

Alloys Having Silver as the Major Constituent

Silver has considerable advantages over the aluminum alloys known in the art. However, silver requires the use of high pressures combined with high temperatures in order to achieve conditions where sufficient metal flow will take place in the damascene process. The melting point of pure silver is approximately 961° C. In the case of silver, the required temperatures are incompatible with other parts of the semiconductor structure such that detrimental effects would be suffered by an integrated circuit. The elements of beryllium, bismuth, copper, germanium, lead and silicon are known to lower the melting point of silver, when added in sufficient quantities. Data for these elements are shown in Table 2. These elements also have relatively low solubilities in silver at temperatures below approximately 200° C. as shown in Table 2.

TABLE 2

Silver Alloy Additions

| Element Added | Maximum Solubility (wt %) | Solubility at 200° C. (wt %) | Solubility at 500° C. (wt %) | Solubility at 700° C. (wt %) | Eutectic Temperature (° C.) |
|---|---|---|---|---|---|
| Beryllium | 0.3 | | | ~0.1 | 881 |
| Bismuth | 5.1* | 0.6 | 5.0 | | 263 |
| Copper | 8.8 | ~1.0 | 2.0 | 6.5 | 780 |
| Germanium | 6.7 | ~2.0 | 5.0 | | 651 |
| Lead | 5.2 | ~1.0 | 4.0 | | 304 |
| Silicon | >0.8 | >0.1 | | | 840 |

*These elements exhibit retrograde solubility above the eutectic temperature; 1.6% by weight of bismuth and 1.5% by weight of lead are soluble at the eutectic temperature.

Common silver-copper alloys are well known in the art. While copper is effective in lowering the melting point in these silver-copper alloy systems, it also detrimentally lowers the electrical and thermal conductivity properties.

Silver-bismuth alloys containing approximately 2% by weight of bismuth will have a melting point of approximately 263° C. while having less than approximately 0.6% by weight of bismuth in solid solution at potential use temperatures. Small amounts of silicon, less than approximately 1% by weight, may be added to further lower the melting temperature without significant reductions in electrical conductivity.

Silver alloys of the invention may be heat treated after force filling to enhance their electrical conductivity. Exposing the alloy, and thus the device containing the alloy, to a temperature of approximately 150° C. for a period of time of approximately one to twenty hours is expected to improve such conductivity.

In one embodiment, the silver alloy has approximately 1.6 to 2.6% by weight of bismuth. In another embodiment, the silver alloy has approximately 1.6 to 2.6% by weight of bismuth and approximately 0.01 to 1% by weight of silicon. In yet another embodiment, the silver alloy has approximately 2% by weight of bismuth and approximately 0.5% by weight of silicon.

Alloys Having Gold as the Major Constituent

Gold has considerable advantages over the aluminum alloys known in the art. However, gold requires the use of high pressures combined with high temperatures in order to achieve conditions where sufficient metal flow will take place in the damascene process. The melting point of pure gold is approximately 1063° C. In the case of gold, the required temperatures are incompatible with other parts of the semiconductor structure such that detrimental effects would be suffered by an integrated circuit. The elements of bismuth, cobalt, germanium, lead, antimony and silicon are known to lower the melting point of gold, when added in sufficient quantities. Data for these elements are shown in Table 3. While the solubility data is incomplete, it is expected that solubilities of bismuth, lead and silicon are less than approximately 0.1% by weight at potential use temperatures.

TABLE 3

Gold Alloy Additions

| Element Added | Maximum Solubility (wt %) | Solubility at 200° C. (wt %) | Solubility at 500° C. (wt %) | Solubility at 700° C. (wt %) | Eutectic Temperature (° C.) |
|---|---|---|---|---|---|
| Bismuth | | | | | 371 |
| Cobalt | 8.4 | | 0.6 | 1.5 | 997 |
| Germanium | 1.2 | | | | 356 |
| Lead | 0.12 | | | | 434 |
| Antimony | 0.7* | | | | 360 |
| Silicon | | | | | 363 |

*This element exhibits retrograde solubility above the eutectic temperature; 0.4% by weight of antimony is soluble at the eutectic temperature.

Gold alloys having one or more of the elements bismuth, lead, antimony and silicon all exhibit desirable melting temperatures with good conductivity. In each case, additions on the order of approximately 1% by weight of each individual addition element would be necessary to achieve the desired results.

In one embodiment, the gold alloy has approximately 0.5 to 1.5% by weight each of one or more of the elements bismuth, lead, antimony and silicon. In another embodiment, the gold alloy has approximately 1% by weight of bismuth. In a further embodiment, the gold alloy has approximately 1% by weight of lead. In a still further embodiment, the gold alloy has approximately 1% by weight of antimony. In one embodiment, the gold alloy has approximately 1% by weight of silicon. In another embodiment, the gold alloy has approximately 1% by weight of bismuth and approximately 0.5% by weight of lead.

Integrated Circuit Devices Having Alloys of the Invention

Memory Devices

Figure 1A:
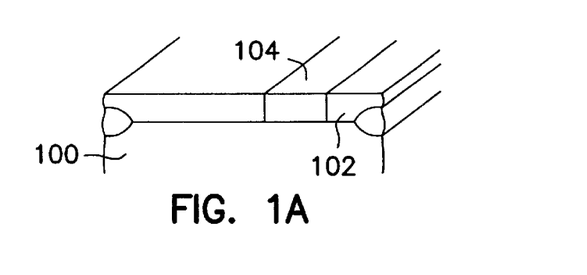
FIG. 1A is an illustration of a portion of a dual damascene fabrication technique according to the invention.
Figure 1B:
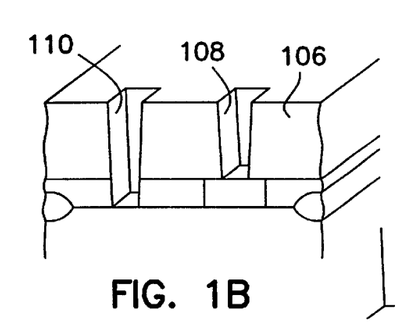
FIG. 1B is an illustration of a portion of a dual damascene fabrication technique according to the invention.
Figure 1C:
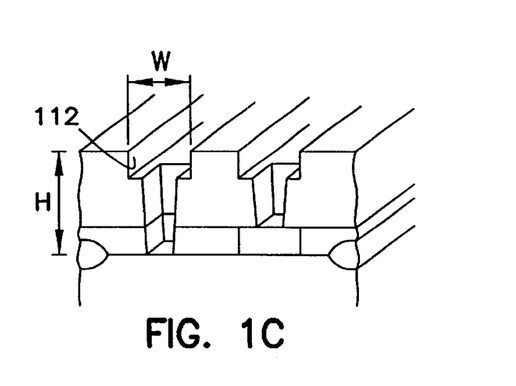
FIG. 1C is an illustration of a portion of a dual damascene fabrication technique according to the invention.
Figure 1D:
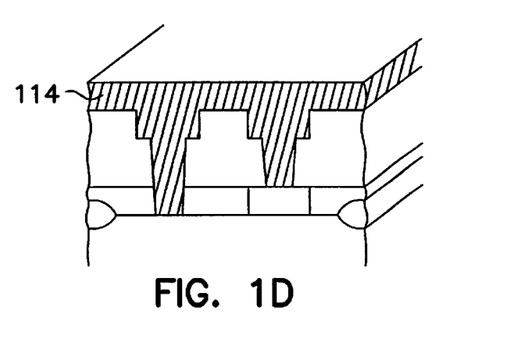
FIG. 1D is an illustration of a portion of a dual damascene fabrication technique according to the invention.
Figure 1E:
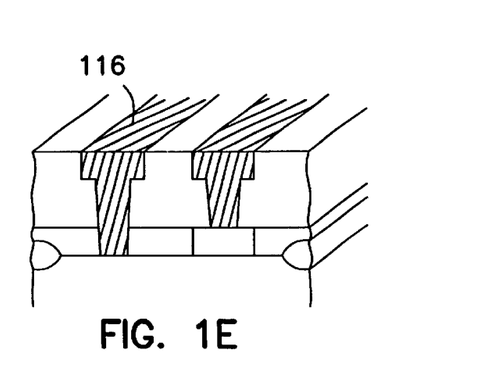
FIG. 1E is an illustration of a portion of a dual damascene fabrication technique according to the invention.
Figure 2:
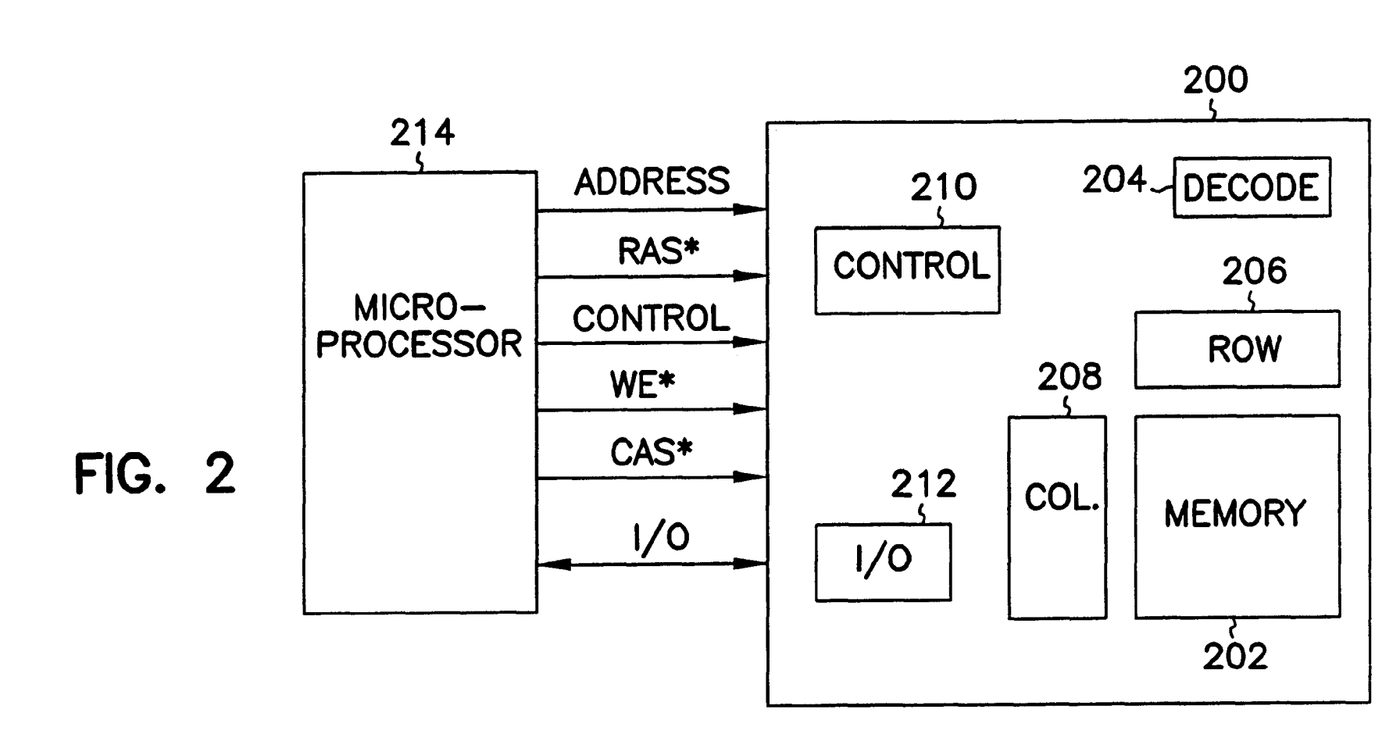
FIG. 2 is a block diagram of an integrated circuit memory device.

FIG. 2 is a simplified block diagram of a memory device according to one embodiment of the invention. The memory device 200 includes an array of memory cells 202, address decoder 204, row access circuitry 206, column access circuitry 208, control circuitry 210, and Input/Output circuit 212. The memory can be coupled to an external microprocessor 214, or memory controller for memory accessing. The memory receives control signals from the processor 214, such as WE*, RAS* and CAS* signals. The memory is used to store data which is accessed via I/O lines. It will be appreciated by those skilled in the art that additional circuitry and control signals can be provided, and that the memory device of FIG. 2 has been simplified to help focus on the invention. Thus, the memory includes internal circuitry, and interconnects which are coupled to the array of memory cells and internal circuitry. At least one of the interconnects is formed with an alloy as disclosed herein.

It will be understood that the above description of a DRAM is intended to provide a general understanding of the memory and is not a complete description of all the elements and features of a DRAM. Further, the invention is equally applicable to any size and type of memory circuit and is not intended to be limited to the DRAM described above. Other alternative types of devices include SRAM or Flash memories. Additionally, the DRAM could be a synchronous DRAM commonly referred to as SGRAM, SDRAM, SDRAM II, and DDR SDRAM, as well as Synchlink or Rambus DRAMs.

As recognized by those skilled in the art, memory devices of the type described herein are generally fabricated as an integrated circuit containing a variety of semiconductor devices. The integrated circuit is supported by a substrate. A substrate is often a silicon wafer, but can additionally refer to silicon-on-insulator (SOI) technology, silicon-on-sapphire (SOS) technology, thin film transistor (TFT) technology and other applicable support structures. The integrated circuits are typically repeated multiple times on each substrate. The substrate is further processed to separate the integrated circuits into dies as is well known in the art.

Semiconductor Dies

Figure 3:
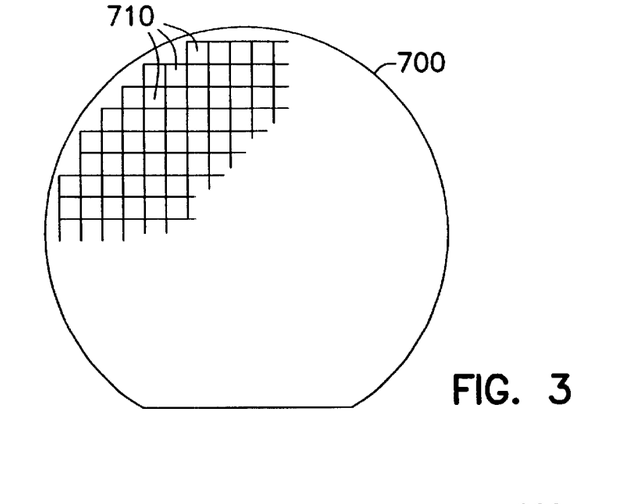
FIG. 3 is an elevation view of a substrate containing semiconductor dies.

With reference to FIG. 3, in one embodiment, a semiconductor die 710 is produced from a silicon wafer 700. A die is an individual pattern, typically rectangular, on a substrate that contains circuitry to perform a specific function. The circuitry of semiconductor die 710 includes metal interconnects. At least one of the metal interconnects is formed with an alloy as disclosed herein. A semiconductor wafer will typically contain a repeated pattern of such dies containing the same functionality. Die 710 may contain circuitry for the inventive memory device, as discussed above. Die 710 may further contain additional circuitry to extend to such complex devices as a monolithic processor with multiple functionality. Die 710 is typically packaged in a protective casing (not shown) with leads extending therefrom (not shown) providing access to the circuitry of the die for unilateral or bilateral communication and control.

Circuit Modules

Figure 4:
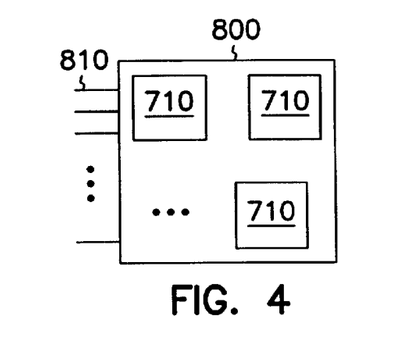
FIG. 4 is a block diagram of an exemplary circuit module.

As shown in FIG. 4, two or more dies 710 may be combined, with or without protective casing, into a circuit module 800 to enhance or extend the functionality of an individual die 710. Circuit module 800 may be a combination of dies 710 representing a variety of functions, or a combination of dies 710 containing the same functionality. Some examples of a circuit module include memory modules, device drivers, power modules, communication modems, processor modules and application-specific modules and may include multilayer, multichip modules. Circuit module 800 may be a subcomponent of a variety of electronic systems, such as a clock, a television, a cell phone, a personal computer, an automobile, an industrial control system, an aircraft and others. Circuit module 800 will have a variety of leads 810 extending therefrom providing unilateral or bilateral communication and control.

Figure 5:
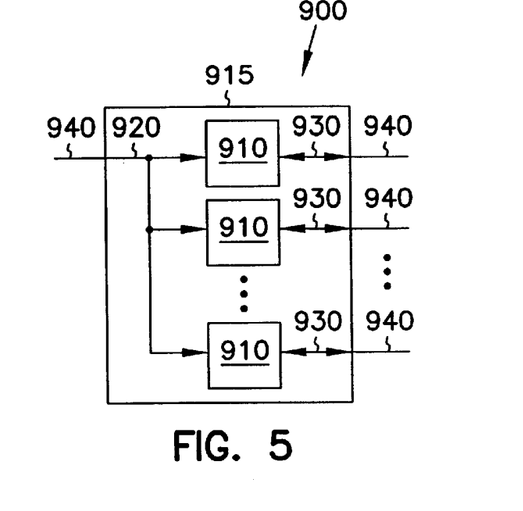
FIG. 5 is a block diagram of an exemplary memory module.

FIG. 5 shows one embodiment of a circuit module as memory module 900. Memory module 900 generally depicts a Single Inline Memory Module (SIMM) or Dual Inline Memory Module (DIMM). A SIMM or DIMM is generally a printed circuit board (PCB) or other support containing a series of memory devices. While a SIMM will have a single in-line set of contacts or leads, a DIMM will have a set of leads on each side of the support with each set representing separate I/O signals. Memory module 900 contains multiple memory devices 910 contained on support 915, the number depending upon the desired bus width and the desire for parity. Memory module 900 may contain memory devices 910 on both sides of support 915. Memory module 900 accepts a command signal from an external controller (not shown) on a command link 920 and provides for data input and data output on data links 930. The command link 920 and data links 930 are connected to leads 940 extending from the support 915. Leads 940 are shown for conceptual purposes and are not limited to the positions shown in FIG. 5.

Electronic Systems

Figure 6:
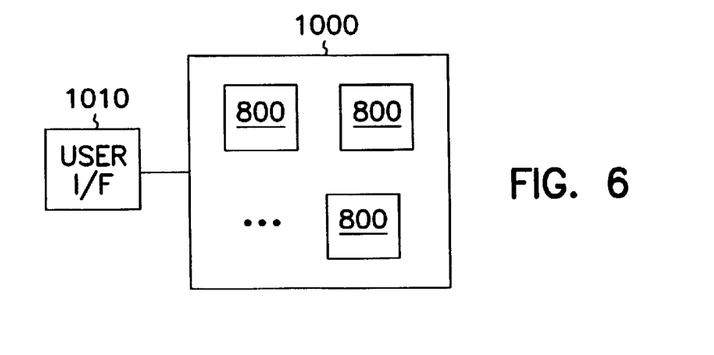
FIG. 6 is a block diagram of an exemplary electronic system.

FIG. 6 shows an electronic system 1000 containing one or more circuit modules 800. Electronic system 1000 generally contains a user interface 1010. User interface 1010 provides a user of the electronic system 1000 with some form of control or observation of the results of the electronic system 1000. Some examples of user interface 1010 include the keyboard, pointing device, monitor and printer of a personal computer; the tuning dial, display and speakers of a radio; the ignition switch and gas pedal of an automobile; and the card reader, keypad, display and currency dispenser of an automated teller machine. User interface 1010 may further describe access ports provided to electronic system 1000. Access ports are used to connect an electronic system to the more tangible user interface components previously exemplified. One or more of the circuit modules 800 may be a processor providing some form of manipulation, control or direction of inputs from or outputs to user interface 1010, or of other information either preprogrammed into, or otherwise provided to, electronic system 1000. As will be apparent from the lists of examples previously given, electronic system 1000 will often contain certain mechanical components (not shown) in addition to circuit modules 800 and user interface 1010. It will be appreciated that the one or more circuit modules 800 in electronic system 1000 can be replaced by a single integrated circuit. Furthermore, electronic system 1000 may be a subcomponent of a larger electronic system.

Figure 7:
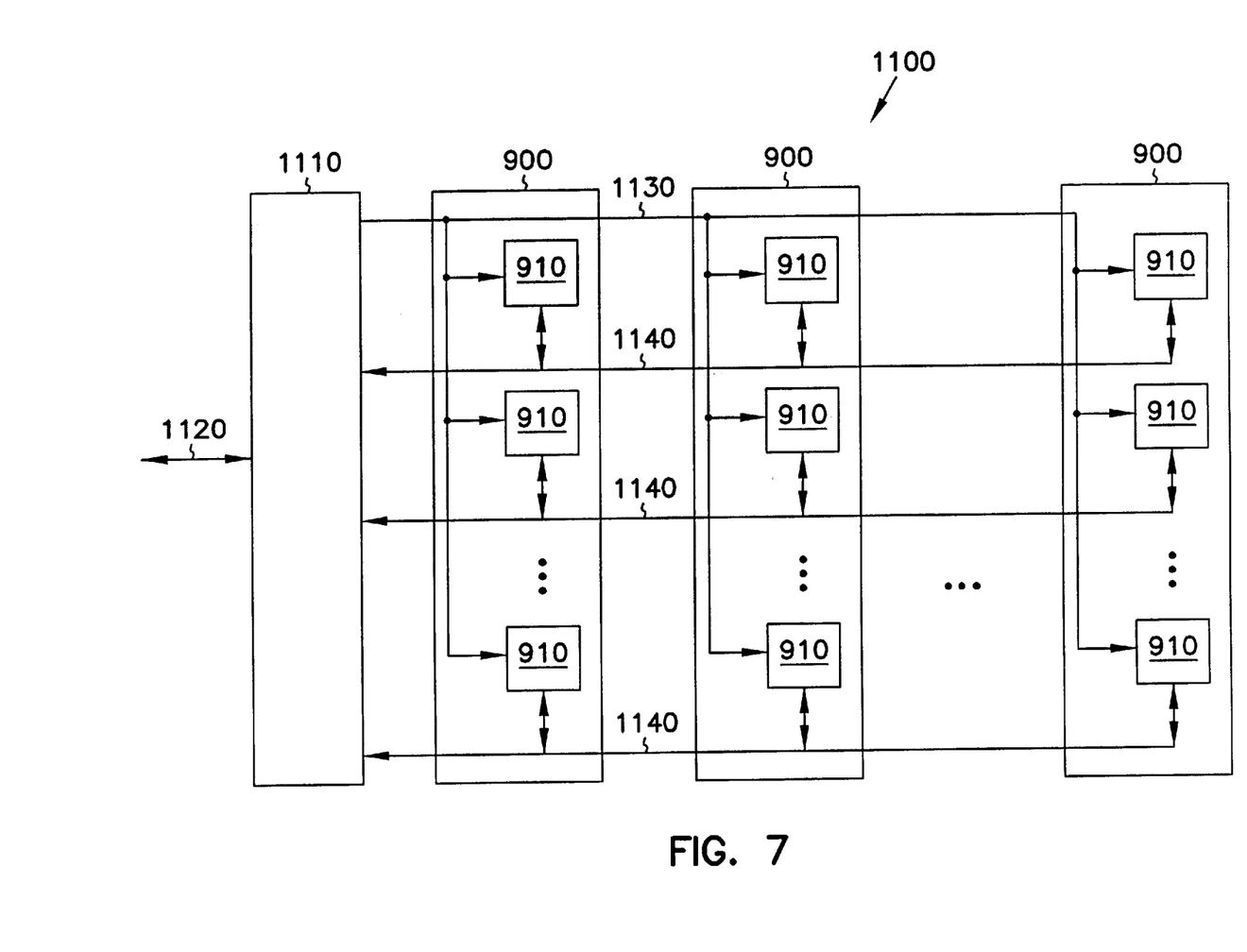
FIG. 7 is a block diagram of an exemplary memory system.

FIG. 7 shows one embodiment of an electronic system as memory system 1100. Memory system 1100 contains one or more memory modules 900 and a memory controller 1110. Memory controller 1110 provides and controls a bidirectional interface between memory system 1100 and an external system bus 1120. Memory system 1100 accepts a command signal from the external bus 1120 and relays it to the one or more memory modules 900 on a command link 1130. Memory system 1100 provides for data input and data output between the one or more memory modules 900 and external system bus 1120 on data links 1140.

Figure 8:
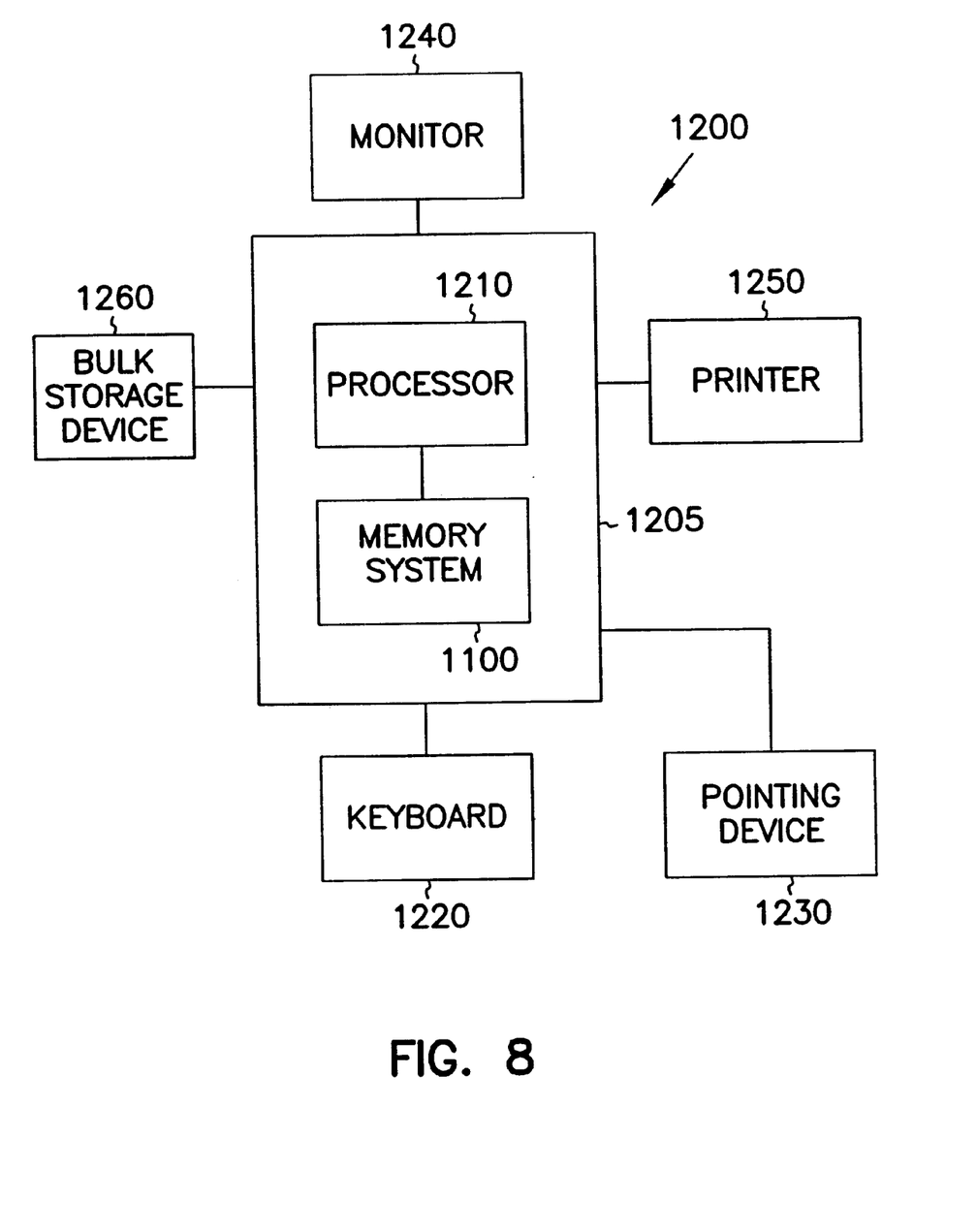
FIG. 8 is a block diagram of an exemplary computer system.

FIG. 8 shows a further embodiment of an electronic system as a computer system 1200. Computer system 1200 contains a processor 1210 and a memory system 1100 housed in a computer unit 1205. Computer system 1200 is but one example of an electronic system containing another electronic system, i.e. memory system 1100, as a subcomponent. Computer system 1200 optionally contains user interface components. Depicted in FIG. 8 are a keyboard 1220, a pointing device 1230, a monitor 1240, a printer 1250 and a bulk storage device 1260. It will be appreciated that other components are often associated with computer system 1200 such as modems, device driver cards, additional storage devices, etc. It will further be appreciated that the processor 1210 and memory system 1100 of computer system 1200 can be incorporated on a single integrated circuit. Such single package processing units reduce the communication time between the processor and the memory circuit.

CONCLUSION

Integrated circuit interconnect alloys have been described having copper, silver or gold as the major constituent element. The resulting reduction in melting temperature allows for improved coverage of high aspect ratio features with a reduced deposition pressure. The alloys are used to fabricate metal interconnects in integrated circuits, such as memory devices. The interconnects can be high aspect ratio features formed using a dual damascene process. The integrated circuits are applicable to semiconductor dies, devices, circuit modules and electronic systems.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the invention. Therefore, it is manifestly intended that this invention be limited only by the claims and the equivalents thereof.

What is claimed is:

1. An integrated circuit memory device comprising:
an array of memory cells;
internal circuitry; and
a plurality of interconnects coupled to the array of memory cells and internal circuitry, wherein at least one of the plurality of interconnects comprises an alloy, the alloy comprising:
copper; and
at least two elements selected from the group consisting of magnesium, phosphorous, titanium, hafnium and zirconium.

2. The integrated circuit memory device of claim 1, wherein the at least one of the plurality of interconnects was fabricated using a dual damascene process.

3. The integrated circuit memory device of claim 1, wherein the at least one of the plurality of interconnects has a eutectic temperature of less than approximately 714° C.

4. An integrated circuit memory device comprising:
an array of memory cells;
internal circuitry; and
a plurality of interconnects coupled to the array of memory cells and internal circuitry, wherein at least one of the plurality of interconnects comprises an alloy, the alloy comprising:
copper;
approximately 4% by weight of magnesium; and
approximately 2% by weight of phosphorous.

5. An integrated circuit memory device comprising:
an array of memory cells;
internal circuitry; and
a plurality of interconnects coupled to the array of memory cells and internal circuitry, wherein at least one of the plurality of interconnects comprises an alloy, the alloy comprising:
copper;
approximately 4% by weight of magnesium;
approximately 2% by weight of phosphorous; and
at least one element selected from the group consisting of zirconium, hafnium and titanium, wherein each at least one element comprises approximately 1 to 2% by weight of the total weight of the alloy.

6. An integrated circuit memory device comprising:
an array of memory cells;
internal circuitry; and
a plurality of interconnects coupled to the array of memory cells and internal circuitry, wherein at least one of the plurality of interconnects comprises an alloy, the alloy comprising:
copper;
approximately 3 to 6% by weight of magnesium;
approximately 1.0 to 2.0% by weight of phosphorus; and
approximately 1.0 to 1.5% by weight of an element selected from the group consisting of hafnium, titanium and zirconium.

7. An integrated circuit memory device comprising:
an array of memory cells;
internal circuitry; and
a plurality of interconnects coupled to the array of memory cells and internal circuitry, wherein at least one of the plurality of interconnects comprises an alloy, the alloy comprising:
copper;
approximately 3 to 6% by weight of magnesium;
approximately 1 to 2% by weight of phosphorus;
approximately 1.0 to 1.5% by weight of hafnium; and
approximately 1.0 to 1.5% by weight of zirconium.

8. An integrated circuit memory device comprising:
an array of memory cells;
internal circuitry; and
a plurality of interconnects coupled to the array of memory cells and internal circuitry, wherein at least one of the plurality of interconnects comprises an alloy, the alloy comprising:
copper;
approximately 3 to 6% by weight of magnesium;
approximately 1 to 2% by weight of phosphorus;
approximately 1 to 2% by weight of hafnium;
approximately 1.0 to 1.5% by weight of titanium; and
approximately 1.0 to 1.5% by weight of zirconium.

9. An integrated circuit memory device comprising:
an array of memory cells;
internal circuitry; and
a plurality of interconnects coupled to the array of memory cells and internal circuitry, wherein at least one of the plurality of interconnects comprises an alloy, the alloy comprising:
silver; and
approximately 1.6 to 2.6% by weight of bismuth.

10. The integrated circuit memory device of claim 9, wherein the at least one of the plurality of interconnects is heat treated.

11. The integrated circuit memory device of claim 9, wherein the at least one of the plurality of interconnects is exposed to temperatures of approximately 150° C. for a period of time from approximately one to twenty hours.

12. An integrated circuit memory device comprising:
an array of memory cells;
internal circuitry; and
a plurality of interconnects coupled to the array of memory cells and internal circuitry, wherein at least one of the plurality of interconnects comprises an alloy, the alloy comprising:
silver;
approximately 1.6 to 2.6% by weight of bismuth; and
less than approximately 1% by weight of silicon.

13. An integrated circuit memory device comprising:
an array of memory cells;
internal circuitry; and
a plurality of interconnects coupled to the array of memory cells and internal circuitry, wherein at least one of the plurality of interconnects comprises an alloy, the alloy comprising:
silver;
approximately 2% by weight of bismuth; and
approximately 0.01 to 1% by weight of silicon.

14. An integrated circuit memory device comprising:
an array of memory cells;
internal circuitry; and
a plurality of interconnects coupled to the array of memory cells and internal circuitry, wherein at least one of the plurality of interconnects comprises an alloy, the alloy comprising:
silver;
approximately 2% by weight of bismuth; and
approximately 0.5% by weight of silicon.

15. An integrated circuit memory device comprising:
an array of memory cells;
internal circuitry; and
a plurality of interconnects coupled to the array of memory cells and internal circuitry, wherein at least one of the plurality of interconnects comprises an alloy, the alloy comprising:
gold; and
at least one element selected from the group consisting of bismuth, lead, antimony and silicon.

16. An integrated circuit memory device comprising:
an array of memory cells;
internal circuitry; and
a plurality of interconnects coupled to the array of memory cells and internal circuitry, wherein at least one of the plurality of interconnects comprises an alloy, the alloy comprising:
gold; and
at least one element selected from the group consisting of bismuth, lead, antimony and silicon, wherein each at least one element comprises approximately 0.5 to 1.5% by weight of the total weight of the alloy.

17. An integrated circuit memory device comprising:
an array of memory cells;
internal circuitry; and
a plurality of interconnects coupled to the array of memory cells and internal circuitry, wherein at least one of the plurality of interconnects comprises an alloy, the alloy comprising:
gold; and
approximately 1% by weight of an element selected from the group consisting of bismuth, lead, antimony and silicon.

18. An integrated circuit memory device comprising:
an array of memory cells;
internal circuitry; and
a plurality of interconnects coupled to the array of memory cells and internal circuitry, wherein at least one of the plurality of interconnects comprises an alloy, the alloy comprising:
gold;
approximately 1% by weight of bismuth; and
approximately 0.5% by weight of lead.

* * * * *